US012408281B2

(12) United States Patent
Tsai et al.

(10) Patent No.: US 12,408,281 B2
(45) Date of Patent: Sep. 2, 2025

(54) CIRCUIT SUBSTRATE AND ELECTRONIC DEVICE

(71) Applicant: ACTRON TECHNOLOGY CORPORATION, Taoyuan (TW)

(72) Inventors: Hsin-Chang Tsai, Taoyuan (TW); Ching-Wen Liu, Taoyuan (TW)

(73) Assignee: ACTRON TECHNOLOGY CORPORATION, Taoyuan (TW)

( * ) Notice: Subject to any disclaimer, the term of this patent is extended or adjusted under 35 U.S.C. 154(b) by 296 days.

(21) Appl. No.: 18/179,378

(22) Filed: Mar. 7, 2023

(65) Prior Publication Data
US 2024/0276656 A1    Aug. 15, 2024

(30) Foreign Application Priority Data
Feb. 9, 2023    (TW) .................................. 112104587

(51) Int. Cl.
H05K 5/00    (2025.01)
H05K 1/18    (2006.01)

(52) U.S. Cl.
CPC ............. *H05K 5/003* (2013.01); *H05K 1/181* (2013.01); *H05K 2201/09145* (2013.01); *H05K 2201/10909* (2013.01)

(58) Field of Classification Search
CPC .... H05K 1/02; H05K 1/18; H05K 1/181–187; H01L 23/498; H01L 23/495;
(Continued)

(56) References Cited

U.S. PATENT DOCUMENTS

2004/0242086 A1* 12/2004 Takagi ................... H05K 1/029
439/885
2008/0080151 A1* 4/2008 Shimizu ............... H05K 3/4046
361/760
(Continued)

FOREIGN PATENT DOCUMENTS

DE    112018002152    1/2020
JP    2012164757    8/2012
(Continued)

OTHER PUBLICATIONS

"Office Action of Germany Counterpart Application", issued on Jul. 19, 2023, with English translation thereof, p. 1-p. 11.
(Continued)

Primary Examiner — Tuan T Dinh
(74) Attorney, Agent, or Firm — JCIPRNET

(57) ABSTRACT

A circuit substrate includes a base material, a first electrode, and a second electrode. The base material has an upper side and a lower side opposite to each other in a length direction. The first electrode extends and is configured on the base material along the length direction. The second electrode is configured beside the first electrode and includes a first portion and a second portion connected to each other. The first portion is configured on the base material along the length direction. The second portion is configured on the base material along a width direction and is located between the upper side and the first electrode. A cross-sectional width of the first portion becomes larger from the lower side to the upper side.

10 Claims, 5 Drawing Sheets

(58) Field of Classification Search
CPC ......... H01L 23/49541; H01L 23/49568; H01L 23/49575
USPC .......................... 361/771–778; 257/660–690
See application file for complete search history.

(56) References Cited

U.S. PATENT DOCUMENTS

| | | | |
|---|---|---|---|
| 2014/0131843 A1* | 5/2014 | Balakrishnan .... | H02M 3/33507 |
| | | | 257/666 |
| 2016/0240489 A1 | 8/2016 | Kung et al. | |
| 2018/0122720 A1* | 5/2018 | Hable ................. | H01L 23/3121 |
| 2020/0273782 A1* | 8/2020 | Quinones .......... | H01L 23/49575 |
| 2020/0365564 A1* | 11/2020 | Mari Curbelo ..... | H01L 23/5386 |

FOREIGN PATENT DOCUMENTS

| | | |
|---|---|---|
| TW | 200939913 | 9/2009 |
| TW | I584427 | 5/2017 |
| WO | 2021079846 | 4/2021 |

OTHER PUBLICATIONS

"Office Action of Japan Counterpart Application", issued on Jul. 23, 2024, p. 1-p. 3.
"Office Action of Taiwan Counterpart Application", issued on Sep. 13, 2023, p. 1-p. 6.
"Office Action of France Counterpart Application", issued on Mar. 21, 2025, p. 1-p. 10.

* cited by examiner

CIRCUIT SUBSTRATE AND ELECTRONIC DEVICE

CROSS-REFERENCE TO RELATED APPLICATION

This application claims the priority benefit of Taiwan application serial no. 112104587, filed on Feb. 9, 2023. The entirety of the above-mentioned patent application is hereby incorporated by reference herein and made a part of this specification.

BACKGROUND

Technical Field

The disclosure relates to a substrate structure and an electronic device, and in particular, to a circuit substrate and an electronic device using the circuit substrate.

Description of Related Art

In the circuit design of a general power module, the outline of the electrode is roughly rectangular, which means that the two opposite sides of the electrode are linear edges, and the sides of the two adjacent electrodes are disposed in parallel. When the current flows through the chips disposed in parallel, the difference between the circuit resistance of the first chip through which the current flows and the circuit resistance of the last chip through which the current flows is at least 11%. Due to the large difference in the circuit resistance between the chips, it is impossible to obtain a uniform current density and shorten the temperature difference between the chips, and the service life of the power module may be quickly diminished under long-term operation.

SUMMARY

The disclosure provides a circuit substrate, which may effectively reduce the circuit resistance between subsequent parallel electronic components configured thereon.

The disclosure also provides an electronic device including the above-mentioned circuit substrate, which may have a uniform current density and may shorten the temperature difference between the electronic components so as to prolong the service life.

The circuit substrate of the disclosure includes a base material, a first electrode, and a second electrode. The base material has an upper side and a lower side opposite to each other in a length direction. The first electrode extends and is configured on the base material along the length direction. The second electrode is configured beside the first electrode and includes a first portion and a second portion connected to each other. The first portion is configured on the base material along the length direction. The second portion is configured on the base material along a width direction and is located between the upper side and the first electrode. A cross-sectional width of the first portion becomes larger from the lower side to the upper side.

The electronic device of the disclosure includes at least one circuit substrate and multiple electronic components. The circuit substrate includes a base material, a first electrode, and a second electrode. The base material has an upper side and a lower side opposite to each other in a length direction. The first electrode extends and is configured on the base material along the length direction. The second electrode is configured beside the first electrode and includes a first portion and a second portion connected to each other. The first portion is configured on the base material along the length direction. The second portion is configured on the base material along a width direction and is located between the upper side and the first electrode. A cross-sectional width of the first portion becomes larger from the lower side to the upper side. The electronic components are configured on the circuit substrate, and the electronic components are located on the first electrode and are connected in parallel. A current is transmitted from the lower side of the base material to the second electrode through the electronic components.

In an embodiment of the disclosure, the above-mentioned first portion of the second electrode has a first side and a second side opposite to each other along the width direction. The first side is located between the first electrode and the second side. The first side is a linear edge and is parallel to the first electrode.

In an embodiment of the disclosure, the above-mentioned second side is an arc edge.

In an embodiment of the disclosure, the above-mentioned second side is a jagged edge.

In an embodiment of the disclosure, the above-mentioned second side is an edge composed of multiple linear shapes and multiple arc shapes alternately arranged.

Based on the above, in the design of the circuit substrate of the disclosure, the cross-sectional width of the first portion of the second electrode becomes larger from the lower side of the base material to the upper side of the base material. Subsequently when the electronic components configured on the first electrode and connected in parallel are electrically connected to the second electrode by wire bonding, the design of the first portion may effectively shorten the circuit resistance between the electronic components. By reducing the circuit resistance between the electronic components, a uniform current density may be obtained and the temperature difference between the electronic components may be shortened, so the service life of the electronic device using the circuit substrate of the disclosure may be improved.

In order to make the above-mentioned features and advantages of the disclosure clearer and easier to understand, the following embodiments are given and described in details with accompanying drawings as follows.

DESCRIPTION OF THE EMBODIMENTS

Figure 1:
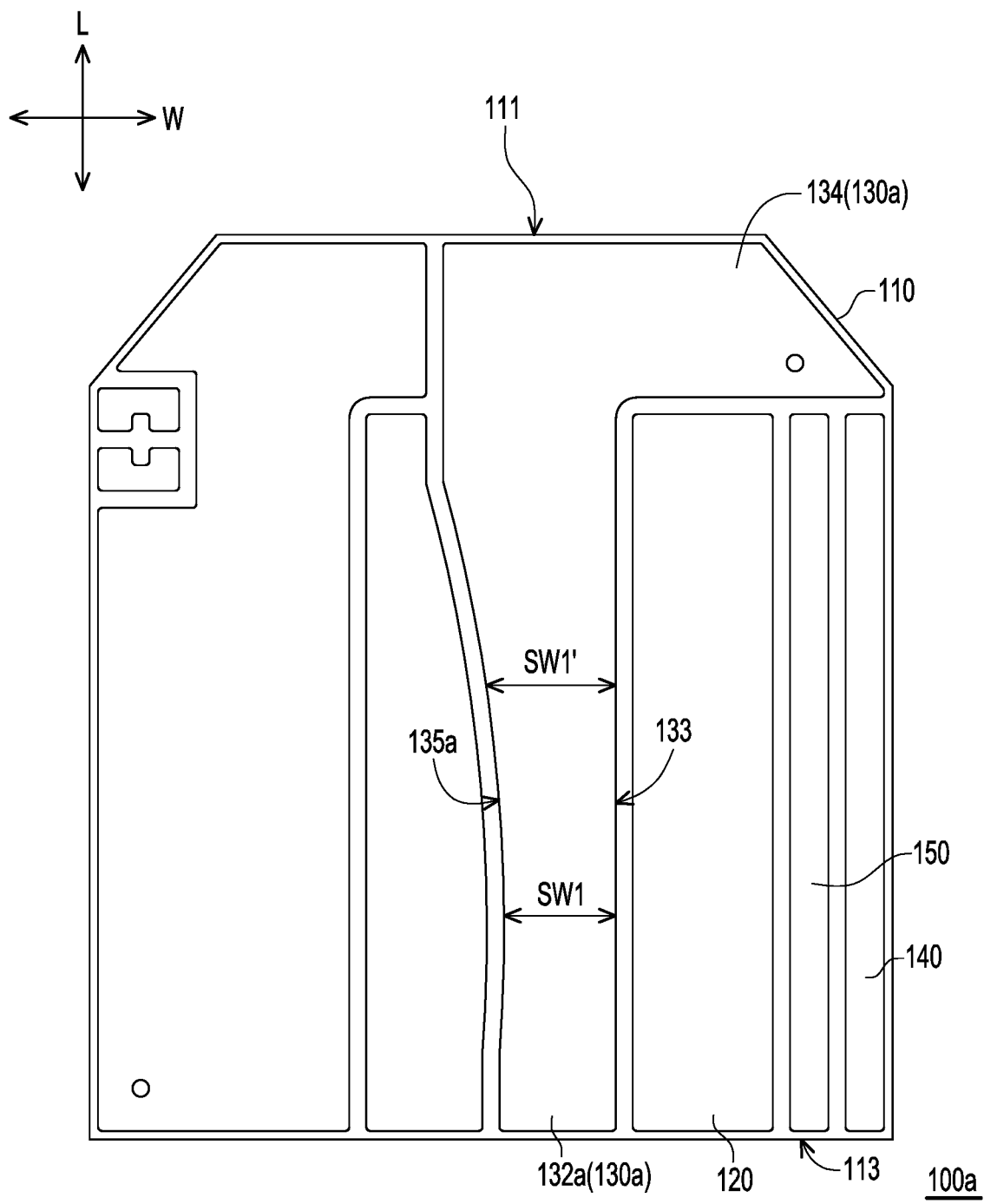
FIG. 1 is a schematic diagram of a circuit substrate according to an embodiment of the disclosure.

FIG. 1 is a schematic diagram of a circuit substrate according to an embodiment of the disclosure. Please refer to FIG. 1. In the present embodiment, a circuit substrate 100a includes a base material 110, a first electrode 120, and a second electrode 130a. The base material 110 has an upper side 111 and a lower side 113 opposite to each other in a length direction L. The first electrode 120 extends and is configured on the base material 110 along the length direction L. The second electrode 130a is configured beside the first electrode 120 and includes a first portion 132a and a second portion 134 connected to each other. The first portion 132a is configured on the base material 110 along the length direction L. The second portion 134 is configured on the base material 110 along a width direction W and is located between the upper side 111 and the first electrode 120. The cross-sectional widths SW1 and SW1' of the first portion 132a become larger from the lower side 113 to the upper side 111.

In detail, in the embodiment, the lower side 113 of the base material 110 may be used as the current input terminal, and the upper side 111 of the base material 110 may be used as the current output terminal. Viewed from above, the outline of the first electrode 120 is embodied as a rectangle. The first electrode 120 may be used as a configuration area for subsequent electronic components. The first portion 132a of the second electrode 130a and the second portion 134a of the second electrode 130a are seamlessly connected to form an L-like shape. It should be noted that the second electrode 130a may be a drain electrode or a source electrode depending on the direction in which subsequent chips are placed, and there is no limitation here. The first portion 132a of the second electrode 130a has a first side 133 and a second side 135a opposite to each other along the width direction W. The first side 133 is located between the first electrode 120 and the second side 135a. The first side 133 is embodied as a linear edge parallel to the first electrode 120, and the second side 135a is embodied as an arc edge. As shown in FIG. 1, the horizontal distance (i.e., in the width direction W) between the first side 133 and the second side 135a is the cross-sectional widths SW1 and SW1'. The cross-sectional width SW1 is smaller than the cross-sectional width SW1'. That is to say, the cross-sectional width SW1 of the first portion 132a closer to the lower side 113 is smaller than the cross-sectional width SW1' of the first portion 132a closer to the upper side 111. The cross-sectional width SW1' of the first portion 132a of the second electrode 130a becomes larger toward the upper side 111.

In addition, please refer to FIG. 1 again. The circuit substrate 100a of the embodiment further includes an electrode 140 and an electrode 150, which extend and are configured on the base material 110 along the length direction L. The electrode 150 is located between the electrode 140 and the first electrode 120. Viewed from a top view, the outline of the electrode 140 and the outline of the electrode 150 are embodied as both rectangular, but are not limited thereto. It should be noted that the electrode 140 may be a drain electrode or a source electrode depending on the direction in which subsequent chips are placed, and the electrode 150 may be, for example, a gate electrode, and there is no limitation here.

It must be noted here that the following embodiments continue to use the referential numbers of the components and a part of the contents of the foregoing embodiments, wherein the same referential numbers are used to denote the same or similar components, and the description of the same technical content is omitted. For the description of the omitted part, reference may be made to the foregoing embodiments, and the details are not repeated here.

Figure 2:
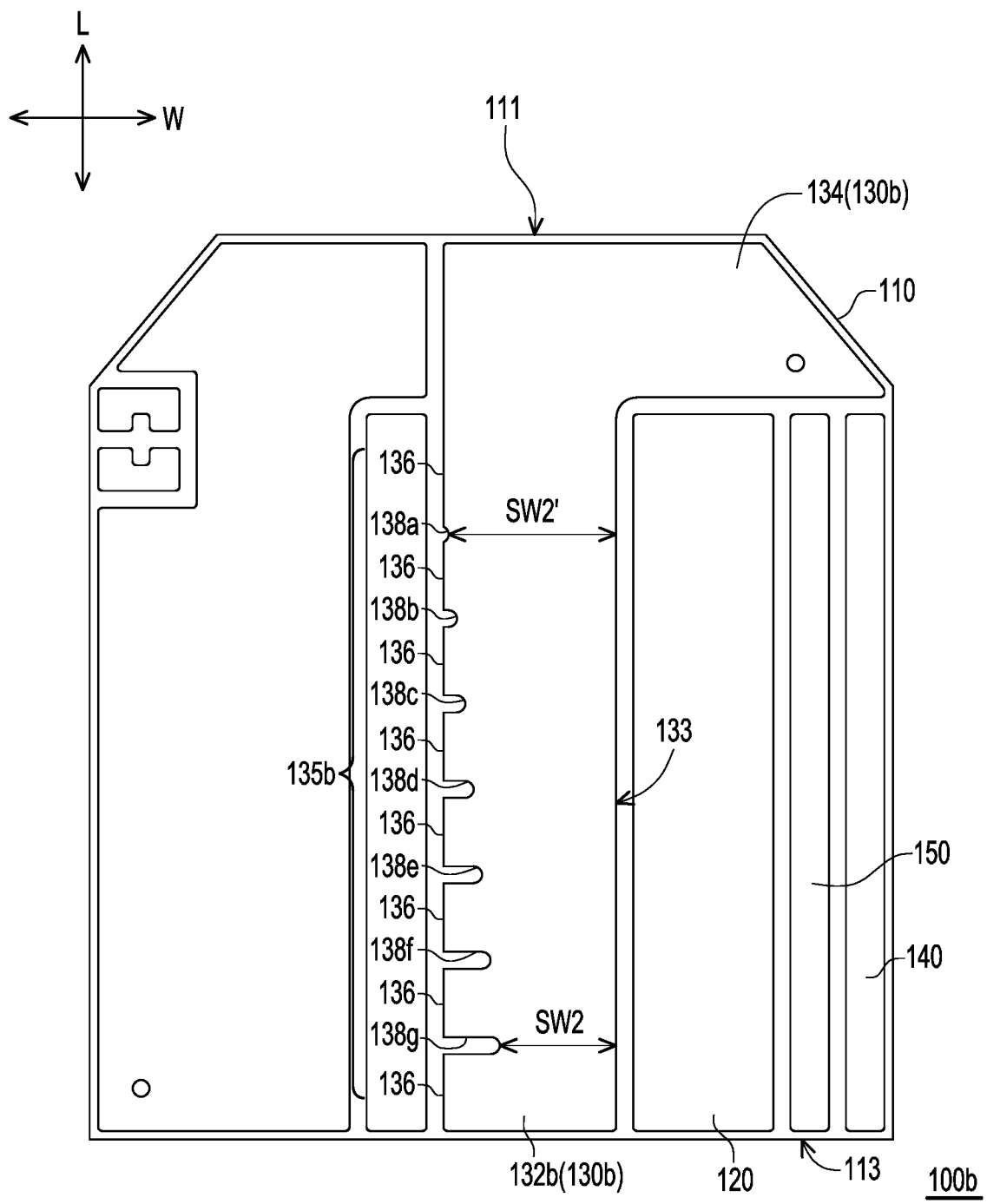
FIG. 2 is a schematic diagram of a circuit substrate according to another embodiment of the disclosure.

FIG. 2 is a schematic diagram of a circuit substrate according to another embodiment of the disclosure. Please refer to FIG. 1 and FIG. 2 at the same time. A circuit substrate 100b of the embodiment is similar to the circuit substrate 100a of FIG. 1. The difference between the two is that, in the embodiment, the structural design of a first portion 132b of a second electrode 130b is different from the structural design of the above-mentioned first portion 132a of the second electrode 130a.

In detail, a second side 135b of the first portion 132b is embodied as an edge composed of multiple linear shapes 136 and multiple arc shapes 138a, 138b, 138c, 138d, 138e, 138f, and 138g alternately arranged. The lengths of the arc shapes 138a, 138b, 138c, 138d, 138e, 138f, and 138g gradually increase from the upper side 111 to the lower side 113 of the base material 110, which means that the length of the arc shape 138a is the shortest, whereas the length of the arc shape 138g is the longest, so that cross-sectional widths SW2 and SW2' of the first portion 132a become larger from the lower side 113 to the upper side 111. Here, the cross-sectional widths SW2 and SW2' are exemplified by the horizontal distances between the arc shapes 138a, 138b, 138c, 138d, 138e, 138f, and 138g from the first side 133 to the second side 135b. In short, the cross-sectional width SW2 of the first portion 132b closer to the lower side 113 is smaller than the cross-sectional width SW2' of the first portion 132b closer to the upper side 111. The cross-sectional width SW2' of the first portion 132b of the second electrode 130b becomes larger toward the upper side 111.

Figure 3:
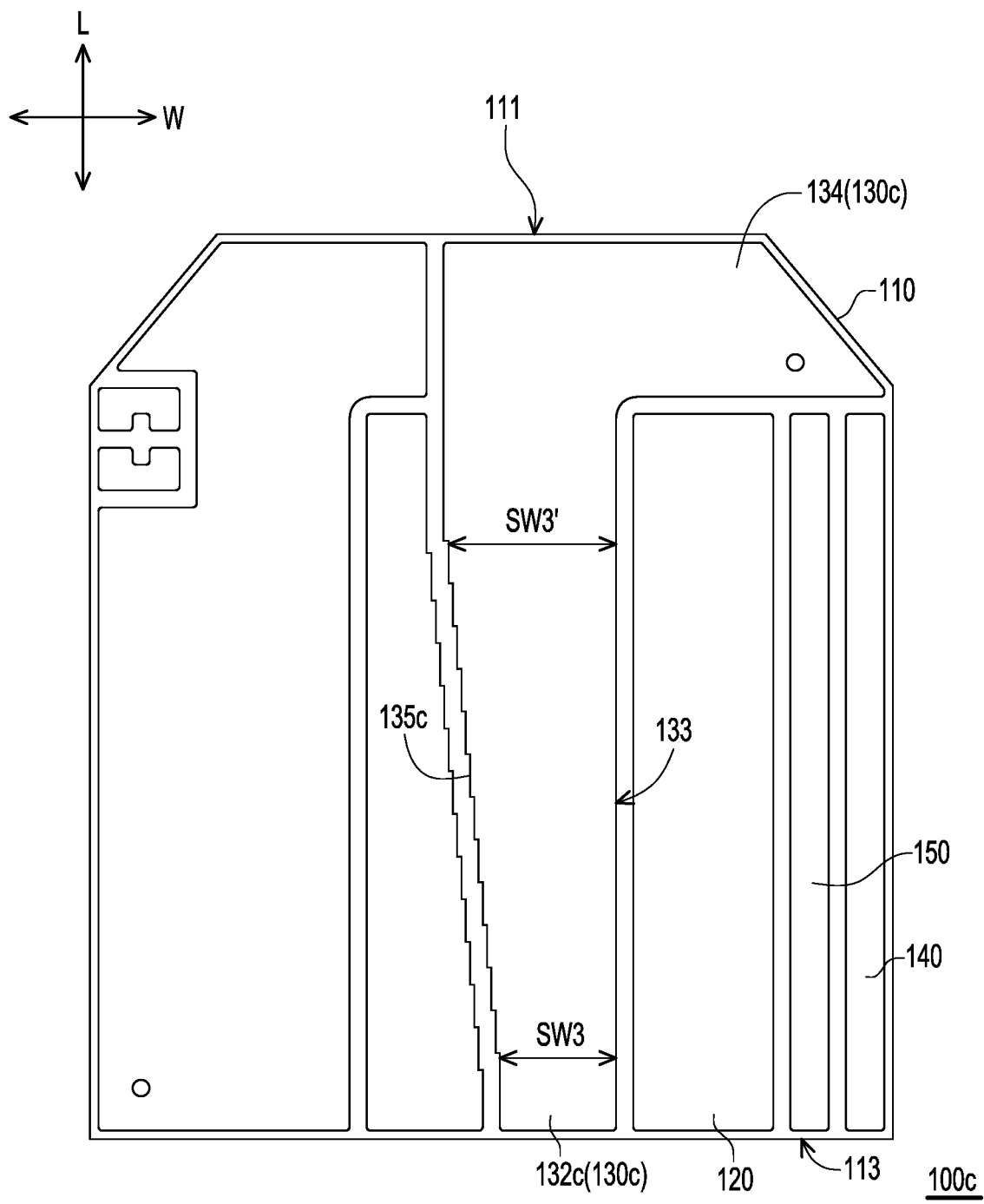
FIG. 3 is a schematic diagram of a circuit substrate according to another embodiment of the disclosure.

FIG. 3 is a schematic diagram of a circuit substrate according to another embodiment of the disclosure. Please refer to FIG. 1 and FIG. 3 at the same time. A circuit substrate 100c of the embodiment is similar to the circuit substrate 100a of FIG. 1. The difference between the two is that, in the embodiment, the structural design of a first portion 132c of a second electrode 130c is different from the structural design of the above-mentioned first portion 132a of the second electrode 130a.

In detail, a second side 135c of the first portion 132c is embodied as a jagged edge. The horizontal distance (i.e., in the width direction W) between the first side 133 and the second side 135c is the cross-sectional widths SW3 and SW3'. The cross-sectional width SW3 is smaller than the cross-sectional width SW3'. That is to say, the cross-sectional width SW3 of the first portion 132c closer to the lower side 113 is smaller than the cross-sectional width SW3' of the first portion 132c closer to the upper side 111. The cross-sectional width SW3' of the first portion 132c of the second electrode 130c becomes larger toward the upper side 111.

It should be noted that the second sides 135a, 135b, and 135c of the first portions 132a, 132b, and 132c illustrated above are respectively embodied as an arc shape edge, an edge composed of linear shapes and arc shapes alternately arranged, and a jagged edge, but are not limited thereto. As long as the structural design may enable the cross-sectional width of the first portions 132a, 132b, and 132c of the second electrodes 130a, 130b, and 130c become larger from the lower side 113 to the upper side 111 of the base material 110, it is considered to be within a protection scope of the disclosure.

Figure 4:
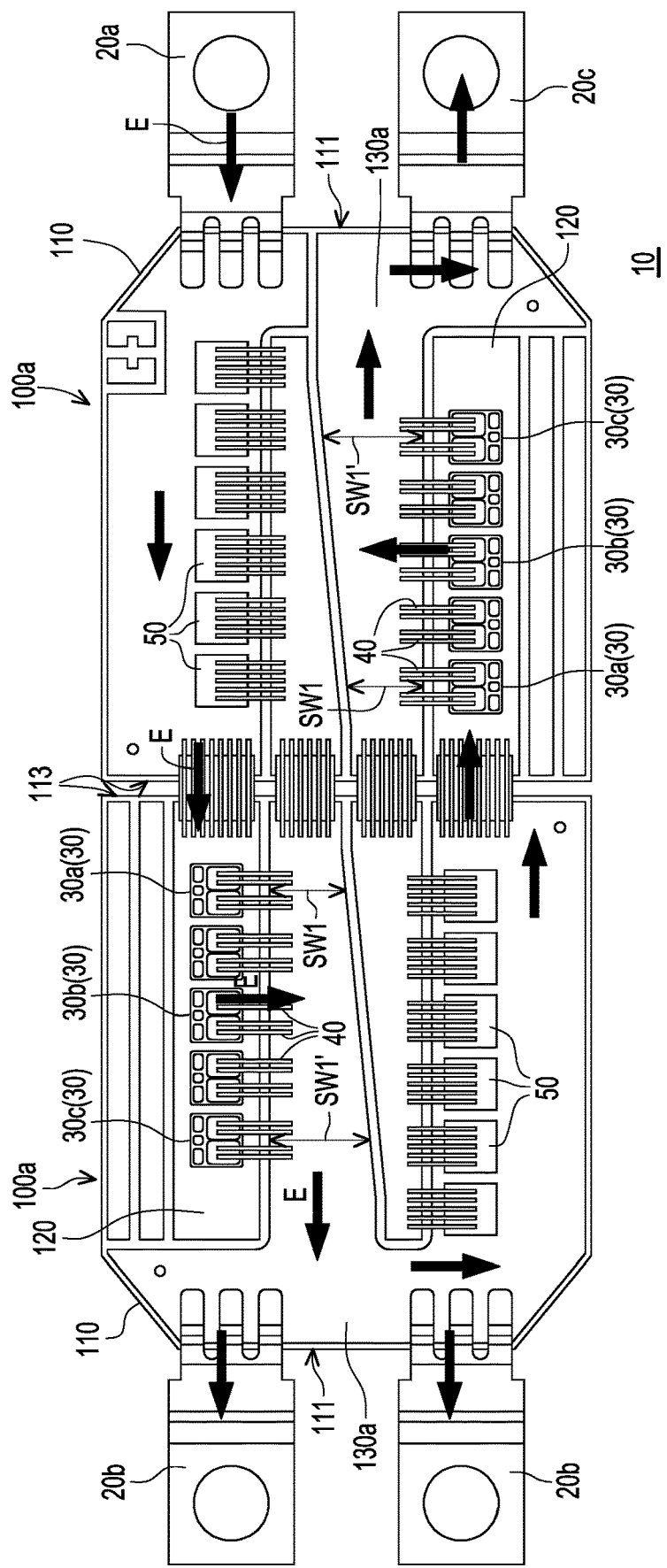
FIG. 4 is a schematic diagram of an electronic device according to an embodiment of the disclosure.

FIG. 4 is a schematic diagram of an electronic device according to an embodiment of the disclosure. Please refer to FIG. 4. In the embodiment, an electronic device 10 includes, for example, the two circuit substrates 100a of FIG. 1, multiple electronic components 30 and 50, and multiple bonding wires 40. The electronic components 30 and 50 are configured on the circuit substrate 100a. The electronic components 30 are located on the first electrode 120 and are connected in parallel. The bonding wire 40 is electrically connected to the electronic component 30 and the second electrode 130a. A current E is transmitted from the lower side 113 of the base material 110 to the second electrode 130a through the electronic component 30 and the bonding wire 40. Here, the electronic device 10 is, for example, a power module. The electronic component 30 is, for example, a diode, and the electronic component 50 is, for example, a transistor, but are not limited thereto.

In detail, the current E may enter the circuit substrate 100a on the right from a conductive terminal 20a, and flow through the electronic component 50 and enter the circuit substrate 100a on the left from the lower side 113. At this time, the current E flows through the electronic components 30 connected in parallel, and enters the second electrode 130a through the bonding wire 40. Since the cross-sectional widths SW1 and SW1' of the second electrode 130a become larger from the lower side 113 to the upper side 111, the circuit resistance between the electronic components 30 may be effectively reduced. According to the simulation results, the resistance value of an electronic component 30a is, for example, 0.84 mΩ 6%, the resistance value of an electronic component 30b is, for example, 0.81 mΩ 2%, and the resistance value of an electronic component 30c is, for example, 0.79 mΩ, which means that the difference in the circuit resistance between the electronic components 30 connected in parallel may be within 6%. Then, the current E may flow through the electronic component 50 and enter the circuit substrate 100a on the right again from the lower side 113, or flow from the upper side 111 of the circuit substrate 100a on the left to two conductive terminals 20b. The current E entering the circuit substrate 100a on the right from the lower side 113 of the base material 110 flows through the electronic components 30 connected in parallel, and enters the second electrode 130a through the bonding wire 40. Since the cross-sectional widths SW1 and SW1' of the second electrode 130a become larger from the lower side 113 to the upper side 111, the circuit resistance between the electronic components 30 may be effectively reduced. Due to the circuit resistance between the electronic components 30 being able to be reduced, a uniform current density may be obtained and the temperature difference between the electronic components 30 may be shortened, so the service life of the electronic device 10 of the embodiment may be improved. Finally, the current E may flow to a conductive terminal 20c through the upper side 111 of the base material 110.

Figure 5:
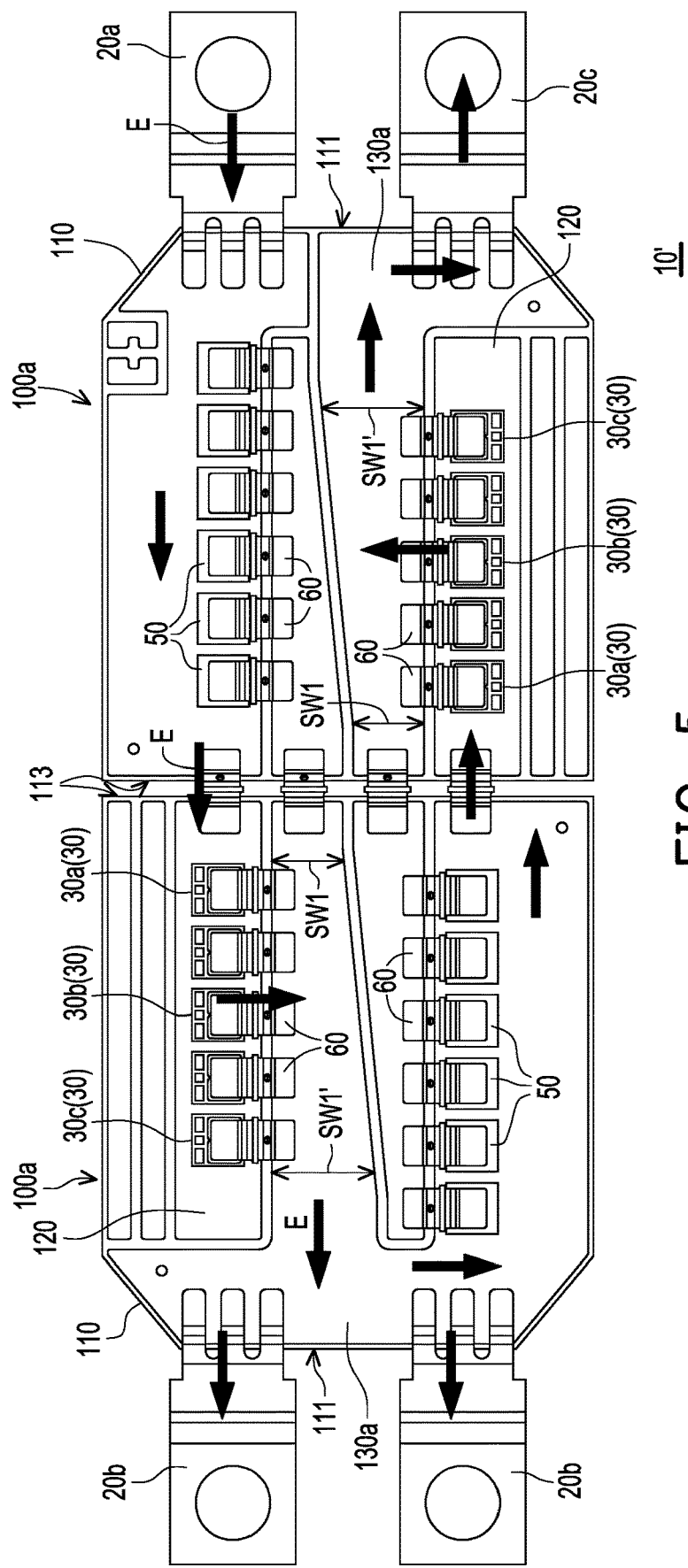
FIG. 5 is a schematic diagram of an electronic device according to another embodiment of the disclosure.

In another embodiment, please refer to FIG. 5. In an electronic device 10' of the embodiment, the electronic device 10' may also replace the bonding wire 40 of the above-mentioned embodiment by using a conductive frame 60. That is to say, the conductive frame 60 may electrically connect the electronic component 30 and the second electrode 130a. The current E is transmitted from the lower side 113 of the base material 110 to the second electrode 130a through the electronic component 30 and the conductive frame 60, and it is considered to be within a protection scope of the disclosure.

To sum up, in the design of the circuit substrate of the disclosure, the cross-sectional width of the first portion of the second electrode becomes larger from the lower side to the upper side of the base material. Subsequently when the electronic components configured on the first electrode and connected in parallel are electrically connected to the second electrode by wire bonding, the design of the first portion may effectively shorten the circuit resistance between the electronic components. By reducing the circuit resistance between the electronic components, a uniform current density may be obtained and the temperature difference between the electronic components may be shortened, so the service life of the electronic device using the circuit substrate of the disclosure may be improved.

Although the disclosure has been described with reference to the embodiments above, the embodiments are not intended to limit the disclosure. Any person skilled in the art can make some changes and modifications without departing from the spirit and scope of the disclosure. Therefore, the scope of the disclosure will be defined in the appended claims.

What is claimed is:

1. A circuit substrate, comprising:
    a base material, having an upper side and a lower side opposite to each other in a length direction;
    a first electrode, extending and being configured on the base material along the length direction;
    a second electrode, configured beside the first electrode and comprising a first portion and a second portion connected to each other, wherein the first portion is configured on the base material along the length direction, the second portion is configured on the base material along a width direction and is located between the upper side and the first electrode, and a cross-sectional width of the first portion becomes larger from the lower side to the upper side;
    a drain electrode or a source electrode extending and configured on the base material along the length direction; and
    a gate electrode extending and configured on the base material along the length direction, wherein the gate electrode is located between the drain electrode or the source electrode and the first electrode, and viewed from a top view, an outline of the drain electrode or the source electrode and an outline of the gate electrode are both rectangular.

2. The circuit substrate according to claim 1, wherein the first portion of the second electrode has a first side and a second side opposite to each other along the width direction, the first side is located between the first electrode and the second side, and the first side is a linear edge and is parallel to the first electrode.

3. The circuit substrate according to claim 2, wherein the second side is an arc edge.

4. The circuit substrate according to claim 2, wherein the second side is a jagged edge.

5. The circuit substrate according to claim 2, wherein the second side is an edge composed of a plurality of linear shapes and a plurality of arc shapes alternately arranged.

6. An electronic device, comprising:
    at least a circuit substrate, comprising:
        a base material, having an upper side and a lower side opposite to each other in a length direction;
        a first electrode, extending and being configured on the base material along the length direction;
        a second electrode, configured beside the first electrode and comprising a first portion and a second portion connected to each other, wherein the first portion is configured on the base material along the length direction, the second portion is configured on the base material along a width direction and is located between the upper side and the first electrode, and a cross-sectional width of the first portion becomes larger from the lower side to the upper side;
        a drain electrode or a source electrode extending and configured on the base material along the length direction; and a gate electrode extending and configured on the base material along the length direction, wherein the gate electrode is located between the drain electrode or the source electrode and the first electrode, and viewed from a top view, an outline of the drain electrode or the source electrode and an outline of the gate electrode are both rectangular; and a plurality of electronic components, configured on the circuit substrate, wherein the electronic components are located on the first electrode and are connected in parallel, and a current is transmitted from the lower side of the base material to the second electrode through the electronic components.

7. The electronic device according to claim 6, wherein the first portion of the second electrode has a first side and a second side opposite to each other along the width direction, the first side is located between the first electrode and the second side, and the first side is a linear edge and is parallel to the first electrode.

8. The electronic device according to claim 7, wherein the second side is an arc edge.

9. The electronic device according to claim 7, wherein the second side is a jagged edge.

10. The electronic device according to claim 7, wherein the second side is an edge composed of a plurality of linear shapes and a plurality of arc shapes alternately arranged.

* * * * *